(12) United States Patent
Naito (10) Patent No.: US 10,186,608 B2
(45) Date of Patent: Jan. 22, 2019

(54) SEMICONDUCTOR APPARATUS

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/638,378

(22) Filed: Jun. 30, 2017

(65) Prior Publication Data

US 2017/0301779 A1 Oct. 19, 2017

Related U.S. Application Data

(63) Continuation of application No. PCT/JP2016/067595, filed on Jun. 13, 2016.

(30) Foreign Application Priority Data

Jul. 7, 2015 (JP) .................. 2015-136177

(51) Int. Cl.
*H01L 29/66* (2006.01)
*H01L 29/739* (2006.01)
(Continued)

(52) U.S. Cl.
CPC ...... *H01L 29/7397* (2013.01); *H01L 27/0629* (2013.01); *H01L 27/0652* (2013.01);
(Continued)

(58) Field of Classification Search
CPC ............... H01L 29/7397; H01L 29/407; H01L 29/4236; H01L 27/0652; H01L 27/0629;
(Continued)

(56) References Cited

U.S. PATENT DOCUMENTS 5,329,142 A 7/1994 Kitagawa et al.
5,508,534 A 4/1996 Nakamura et al.
(Continued)

FOREIGN PATENT DOCUMENTS

JP H05-243561 A 9/1993
JP H07-235676 A 9/1995
(Continued)

OTHER PUBLICATIONS

International Search Report for International Patent Application No. PCT/JP2016/067595, issued by the Japan Patent Office dated Jul. 12, 2016.
(Continued)

*Primary Examiner* — Vu A Vu (57) ABSTRACT

A semiconductor apparatus comprises a semiconductor substrate, a dummy trench section which is formed in a front surface of the semiconductor substrate, and a first front-surface-side electrode which is formed above the front surface of the semiconductor substrate and contains metals, and the dummy trench section has a dummy trench formed in the front surface of the semiconductor substrate, an insulation film formed on an inner wall of the dummy trench, a dummy conductive section formed inside the dummy trench on an inner side than the insulation film, and a protection section having an opening to expose at least a part of the dummy conductive section and covering the insulation film on the front surface of the semiconductor substrate, and the first front-surface-side electrode has a portion formed within the opening of the protection section and contacts with the dummy conductive section.

17 Claims, 7 Drawing Sheets

(51) Int. Cl.
*H01L 29/78* (2006.01)
*H01L 27/06* (2006.01)
*H01L 29/40* (2006.01)
*H01L 29/423* (2006.01)
*H01L 29/06* (2006.01)
*H01L 29/08* (2006.01)
*H01L 27/07* (2006.01)
*H01L 29/10* (2006.01)

(52) U.S. Cl.
CPC ...... *H01L 29/0615* (2013.01); *H01L 29/0696* (2013.01); *H01L 29/0834* (2013.01); *H01L 29/407* (2013.01); *H01L 29/4236* (2013.01); *H01L 29/4238* (2013.01); *H01L 29/78* (2013.01); *H01L 27/0727* (2013.01); *H01L 29/1095* (2013.01)

(58) Field of Classification Search
CPC ............ H01L 29/4238; H01L 29/0696; H01L 29/0615; H01L 29/0834; H01L 29/78; H01L 27/0727; H01L 29/1095
USPC ...................................................... 257/140
See application file for complete search history.

(56) References Cited

U.S. PATENT DOCUMENTS

| | | | |
|---|---|---|---|
| 6,118,150 A | 9/2000 | Takahashi | |
| 6,380,087 B1 * | 4/2002 | Gupta | H01L 21/7684 |
| | | | 257/E21.583 |
| 8,680,610 B2 * | 3/2014 | Hsieh | H01L 29/7813 |
| | | | 257/302 |
| 8,692,322 B2 * | 4/2014 | Pan | H01L 29/407 |
| | | | 257/334 |
| 8,698,195 B2 * | 4/2014 | Oya | H01L 29/0696 |
| | | | 257/133 |
| 2002/0179976 A1 | 12/2002 | Takahashi | |
| 2003/0141542 A1 | 7/2003 | Ishimura et al. | |
| 2007/0210350 A1 | 9/2007 | Omura et al. | |
| 2016/0027906 A1 | 1/2016 | Onozawa | |

FOREIGN PATENT DOCUMENTS

| | | |
|---|---|---|
| JP | H09-270512 A | 10/1997 |
| JP | 2002-353456 A | 12/2002 |
| JP | 2003-224278 A | 8/2003 |
| JP | 2004-228172 A | 8/2004 |
| JP | 2007-273931 A | 10/2007 |
| JP | 2007-324539 A | 12/2007 |
| JP | 2010-050211 A | 3/2010 |
| JP | 2011-129750 A | 6/2011 |
| JP | 2012-028567 A | 2/2012 |
| JP | 2014-158041 A | 8/2014 |
| JP | 2014-165364 A | 9/2014 |
| WO | 2014/168171 A1 | 10/2014 |

OTHER PUBLICATIONS

Office Action issued for counterpart Japanese Application 2017-527147, issued by the Japan Patent Office dated May 15, 2018.

* cited by examiner

SEMICONDUCTOR APPARATUS

The contents of the following Japanese patent application(s) are incorporated herein by reference:
NO. 2015-136177 filed in JP on Jul. 7, 2015, and
NO. PCT/JP2016/067595 filed on Jun. 13, 2016.

BACKGROUND

1. Technical Field

The present invention relates to semiconductor apparatuses.

2. Related Art

Conventionally, a configuration has been known, in which electrodes such as gates are formed in trenches provided in a substrate front surface in a semiconductor element (for example, refer to Patent Document 1). Insulation films are formed along inner walls of the trenches and the electrodes such as polysilicon are formed on inner sides of the insulation films.

PRIOR ART DOCUMENTS

Patent Document

[Patent Document 1] Japanese Patent Application Publication No. 2002-353456

SUMMARY

By keeping miniaturizing the semiconductor element, the insulation film formed on the inner wall of the trench also becomes thin. As a result, a reliability of the insulation film in the vicinity of a trench opening is lowered.

In one aspect of the present invention, a semiconductor apparatus is provided, the semiconductor apparatus comprising a semiconductor substrate, a dummy trench section, and a first front-surface-side electrode. The dummy trench section may be formed in a front surface of the semiconductor substrate. The first front-surface-side electrode may be formed above the front surface of the semiconductor substrate. The first front-surface-side electrode may contain metals. The dummy trench section may have a dummy trench, an insulation film, a dummy conductive section, and a protection section. The dummy trench may be formed in the front surface of the semiconductor substrate. The insulation film may be formed on an inner wall of the dummy trench. The dummy conductive section may be formed, inside the dummy trench, on the inner side than the insulation film. The protection section may have an opening to expose at least a part of the dummy conductive section and cover the insulation film in the front surface of the semiconductor substrate. The first front-surface-side electrode may have a portion formed within the opening of the protection section. The first front-surface-side electrode may contact with the dummy conductive section.

The semiconductor apparatus may further comprise a gate trench section. The gate trench section may be formed in the front surface of the semiconductor substrate. The gate trench section may have a gate trench, an insulation film, a gate conductive section, and a gate insulation section. The gate trench may be formed in the front surface of the semiconductor substrate. The insulation film may be formed on the inner wall of the gate trench. The gate conductive section may be formed, inside the gate trench, on the inner side than the insulation film. The gate insulation section may be provided above the gate conductive section. The gate insulation section may insulate the gate conductive section and the first front-surface-side electrode from each other.

The gate insulation section may be provided covering the gate trench in the front surface of the semiconductor substrate. A width of the opening formed in the protection section may be smaller than a distance between the protection section and the gate insulation section which are provided adjacent to each other.

The first front-surface-side electrode may have a dummy plug section and an electrode section. The dummy plug section may be formed within the opening of the protection section. The dummy plug section may contact with the dummy conductive section. The dummy plug section may be a metal. The electrode section may be formed above the dummy plug section. The electrode section may be a metal material different from the dummy plug section.

The dummy plug section may contain tungsten.

The first front-surface-side electrode may further comprise a mesa plug section. The mesa plug section may be formed of the same material as the dummy plug section. The mesa plug section may be formed between the protection section and the gate insulation section. The mesa plug section may contact with the front surface of the semiconductor substrate.

The dummy plug section may be longer than the mesa plug section in a depth direction.

The dummy trench section may be formed extending in a predetermined extending direction in the front surface of the semiconductor substrate. The gate trench section may have an opposing section and a protruding section. The opposing section may be formed extending in an extending direction in an area opposed to the dummy trench section. The protruding section may be formed further extending from the opposing section in an area not opposed to the dummy trench section. The semiconductor apparatus may further comprise a second front-surface-side electrode. The second front-surface-side electrode may be formed above the protruding section. The gate conductive section in the protruding section may be electrically connected to the second front-surface-side electrode.

The gate insulation section of the protruding section may have an opening to expose the gate conductive section. The second front-surface-side electrode may have a gate plug section. The second front-surface-side electrode may be formed within the opening of the gate insulation section. The second front-surface-side electrode may contact with the gate conductive section. The second front-surface-side electrode may be a metal.

The gate plug section may be formed of the same material as the dummy plug section.

The gate plug section may have the same length as the dummy plug section in the depth direction.

The summary clause does not necessarily describe all necessary features of the embodiments of the present invention. The present invention may also be a sub-combination of these features.

DESCRIPTION OF EXEMPLARY EMBODIMENTS

Hereinafter, the present invention is described through the embodiments of the invention. However, the following embodiments do not limit the invention according to the claims. Also, all the combinations of the features described in the embodiments are not necessarily essential for solving means the invention.

Figure 1:
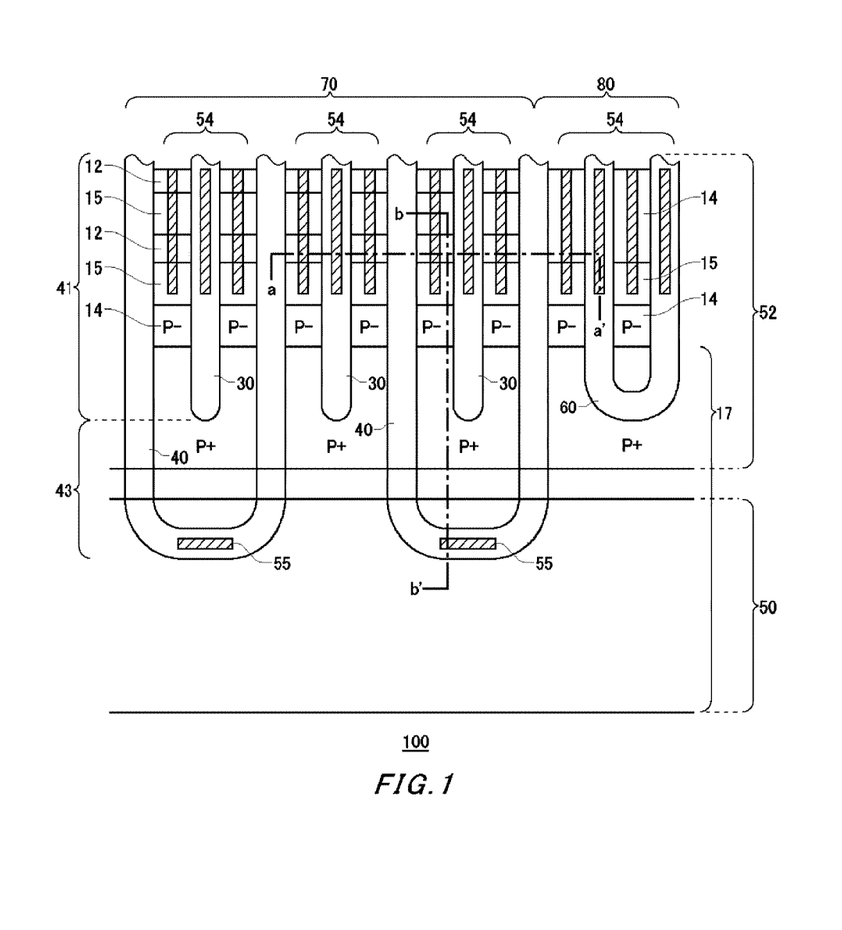
FIG. 1 is a plan view showing one example of a semiconductor apparatus 100.

FIG. 1 is a plan view showing one example of the semiconductor apparatus 100. The semiconductor apparatus 100 of the present example is a semiconductor chip which has a transistor section 70 including a transistor such as an IGBT (Insulated Gate Bipolar Transistor) and a diode section 80 including a diode such as an FWD (Free Wheel Diode). In FIG. 1, a chip front surface in the periphery of a chip end portion is shown and other regions are omitted.

Also, although FIG. 1 shows an active region of the semiconductor substrate in the semiconductor apparatus 100, the semiconductor apparatus 100 may have an edge termination structure section surrounding the active region. The active region refers to a region through which currents flow in a case where the semiconductor apparatus 100 is controlled in an ON state. The edge termination structure section reduces electric field concentration on the front surface side of the semiconductor substrate. For example, the edge termination structure section includes structures of a guard ring, a field plate, a resurf, and combinations thereof.

The semiconductor apparatus 100 of the present example comprises, on the front surface side of the chip, a gate electrode 50, an emitter electrode 52, a gate trench section 40, a dummy trench section 30, an emitter trench section 60, a well region 17, an emitter region 12, a base region 14, a contact region 15, a contact hole 54, and a contact hole 55. The emitter electrode 52 is one example of the first front-surface-side electrode, and the gate electrode 50 is one example of the second front-surface-side electrode.

The gate trench section 40, the dummy trench section 30, the emitter trench section 60, the well region 17, the emitter region 12, the base region 14, and the contact region 15 are formed inside the semiconductor substrate on the front surface side, and the emitter electrode 52 and the gate electrode 50 are provided above the front surface of the semiconductor substrate.

An interlayer insulation film is formed between the front surface of the semiconductor substrate and both the emitter electrode 52 and the gate electrode 50, although the interlayer insulation film is omitted in FIG. 1. The contact hole 54 and the contact hole 55 are formed penetrating the interlayer insulation film. The emitter electrode 52 contacts with the semiconductor substrate through the contact hole 54. The gate electrode 50 contacts with the semiconductor substrate through the contact hole 55.

The emitter electrode 52 and the gate electrode 50 are formed of materials containing metals. For example, at least a part of regions of each electrode is formed of aluminum. Each electrode may have a region formed of materials containing tungsten.

One or more gate trench sections 40 and one or more dummy trench sections 30 are arrayed at a predetermined interval along a predetermined array direction in the region of the transistor section 70. The dummy trench section 30 is formed extending in a predetermined extending direction in the front surface of the semiconductor substrate. The dummy trench section 30 in the present example has a linear shape and is formed extending in a direction perpendicular to the above-described array direction.

The gate trench section 40 has an opposing section 41 and a protruding section 43. The opposing section 41 is formed extending in the above-described extending direction in an area opposed to the dummy trench section 30. That is, the opposing section 41 is formed parallel to the dummy trench section 30. The protruding section 43 further extends from the opposing section 41 and is formed in an area which is not opposed to the dummy trench section 30. In the present example, two opposing sections 41 provided on both sides of the dummy trench section 30 are connected to each other via one protruding section 43. At least a part of the protruding section 43 may have a curved shape.

The contact hole 55 is formed in the insulation layer which covers the protruding section 43. The contact hole 55 may be formed corresponding to the farthest region from the opposing section 41 in the protruding section 43. The protruding section 43 in the present example has a portion extending in a direction orthogonal to the opposing section 41 in the farthest region from the opposing section 41. The contact hole 55 may be formed corresponding to the portion of the protruding section 43.

The emitter trench section 60 is provided in a region of the diode section 80. The emitter trench section 60 may have a similar shape to the gate trench section 40. However, a length in the extending direction of the emitter trench section 60 may be shorter than the gate trench section 40. The length of the emitter trench section 60 in the present example is the same as that of the dummy trench section 30.

The gate electrode 50 is formed covering a part of the protruding section 43. The gate electrode 50 is formed covering the portion in which the contact hole 55 is provided in the protruding section 43. The gate electrode 50 of the present example is not formed above the opposing section 41, the dummy trench section 30, and the emitter trench section 60.

the emitter electrode 52 is formed above the gate trench section 40, the dummy trench section 30, the emitter trench section 60, the well region 17, the emitter region 12, the base region 14, and the contact region 15. The emitter electrode 52 of the present example is formed covering a part of the well region 17 and a part of the gate trench section 40.

The well region 17 is formed in a predetermined area from the end portion of the semiconductor substrate on the side where the gate electrode 50 is provided. A diffusion depth of the well region 17 may be deeper than depths of the gate trench section 40, the dummy trench section 30, and the emitter trench section 60. Parts on the gate electrode 50 side of regions of the dummy trench section 30, the emitter trench section 60, and the opposing section 41 are formed in the well region 17. A bottom portion of the end of the dummy trench section 30 in the extending direction may be covered by the well region 17. The entire protruding section 43 may be formed in the well region 17. The semiconductor substrate has a first conductivity type, and the well region 17 has a second conductivity type which is different from the type of the semiconductor substrate. The semiconductor substrate of the present example is N− type, and the well region 17 is P+ type. In the present example, it is assumed that the first conductivity type is N type and the second conductivity type is P type. However, the first and the second conductivity types may be the conductivity types reverse to the above.

The base region 14 is formed in regions each sandwiched between the respective trench sections. The base region 14 is the second conductivity type with a lower impurity concentration than that of the well region 17. The base region 14 of the present example is P− type.

In the front surface of the base region 14, the contact region 15 of the second conductivity type with a higher impurity concentration than that of the base region 14 is formed. The contact region 15 of the present example is P+ type. Also, in the transistor section 70, the emitter region 12 of the first conductivity type with a higher impurity concentration than that of the semiconductor substrate is optionally formed in a part of the front surface of the contact region 15. The emitter region 12 of the present example is N+ type.

Each of the contact region 15 and the emitter region 12 is formed from a trench section to another trench section adjacent thereto. One or more contact regions 15 and one or more emitter regions 12 of the transistor section 70 are formed so as to be alternately exposed along the extending direction of the trench section in the regions sandwiched by the respective trench sections.

In the transistor section 70, the contact hole 54 is formed above each region of the contact region 15, the emitter region 12, and the dummy trench section 30. The contact hole 54 exposes the central section of the dummy trench section 30, the emitter region 12, and the contact region 15, and does not expose the end portion of the dummy trench section 30 and the gate trench section 40.

The semiconductor apparatus 100 of the present example has a plurality of contact holes 54 formed extending in a direction parallel to the extending direction of the dummy trench section 30. Specifically, the contact hole 54 is formed along the center of each of the dummy trench sections 30. The contact hole 54 does not expose the end portion of the dummy trench section 30.

Also, the contact holes 54 spaced apart from the dummy trench section 30 are formed on both sides of each of the dummy trench sections 30. The contact holes 54 are formed extending across one or more contact regions 15 and one or more emitter regions 12. The contact holes 54 may not be formed in the base region 14. The contact holes 54 formed on both sides of the dummy trench section 30 are provided in an area opposed to the contact hole 54 formed along the center of the dummy trench section 30.

Also, the contact hole 54 is formed spaced apart from the gate trench section 40. The contact hole 54 may be arranged in an approximate center between the gate trench section 40 and the dummy trench section 30.

According to such a configuration, the end portion of the dummy trench section 30 can be covered by the interlayer insulation film while causing the central section of the dummy trench section 30 to contact with the emitter electrode 52. For this reason, the insulation film formed on the inner wall of the dummy trench section 30 can be protected.

Also, similar to the diode section 80, the contact hole 54 is formed above each region of the contact region 15, the base region 14, and the emitter trench section 60. The contact hole 54 exposes the central section of the emitter trench section 60, the contact region 15, and the base region 14, and does not expose the end portion of the emitter trench section 60. The contact hole 54 of the present example is not formed in the base region 14 which is closest to the gate electrode 50 among the plurality of base regions 14. In the present example, the contact hole 54 of the transistor section 70 and the contact hole 54 of the diode section 80 have the same lengths in the extending direction of each trench section.

According to such a configuration, the end portion of the emitter trench section 60 can be covered by the interlayer insulation film while causing the central section of the emitter trench section 60 to contact with the emitter electrode 52. For this reason, the insulation film formed on the inner wall of the emitter trench section 60 can be protected.

Figure 2:
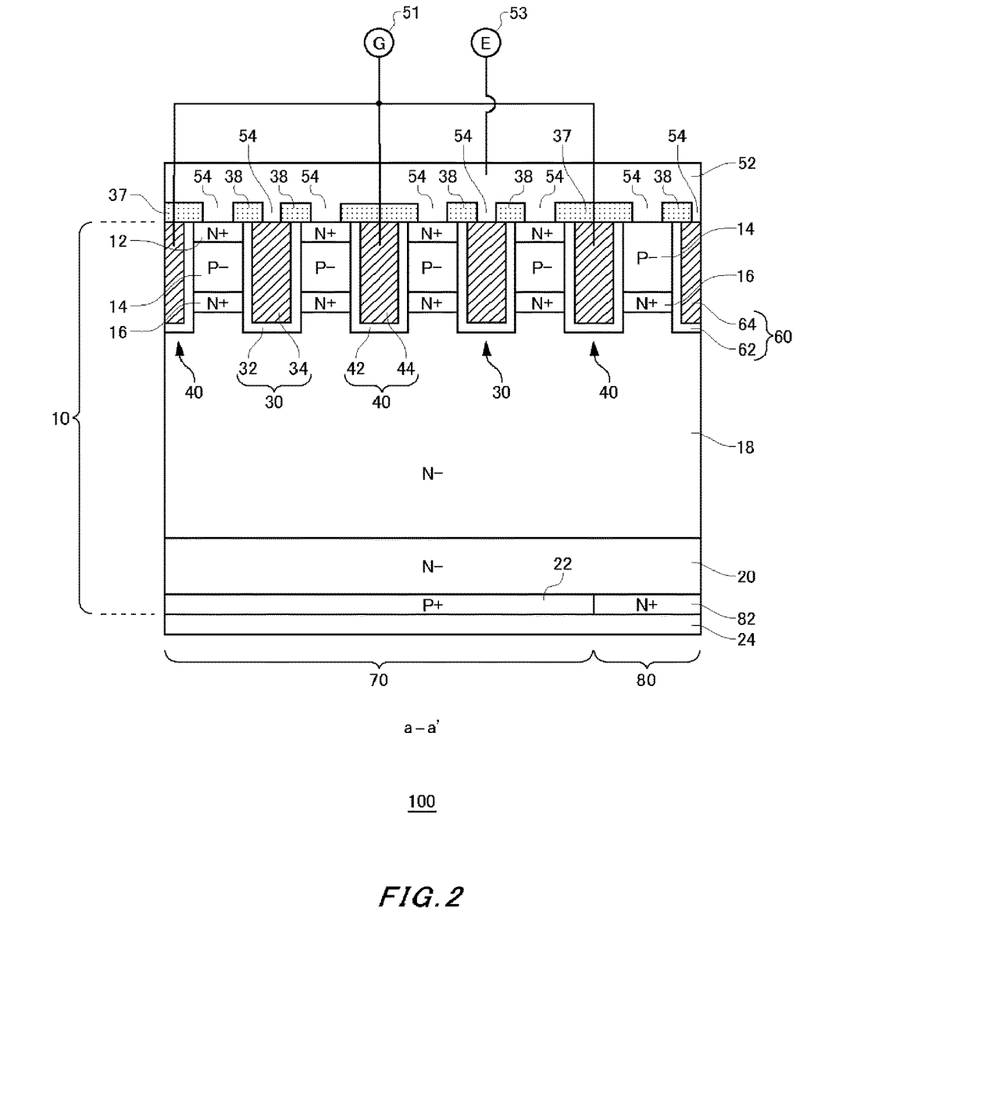
FIG. 2 is a drawing showing one example of a cross section a-a' in FIG. 1.

FIG. 2 is a drawing showing one example of the cross section a-a' in FIG. 1. The semiconductor apparatus 100 of the present example has a semiconductor substrate 10, an emitter electrode 52, and a collector electrode 24 in the cross section. In the front surface of the semiconductor substrate 10 of the present example, a gate insulation section 37 and a protection section 38 are formed. The gate insulation section 37 and the protection section 38 of the present example are parts of the interlayer insulation film formed on the front surface of the semiconductor substrate 10. For example, the gate insulation section 37 and the protection section 38 are parts of the insulation film, such as a PSG film or a BPSG film, formed in a predetermined pattern on the front surface of the semiconductor substrate 10. The emitter electrode 52 is formed in the front surface of the semiconductor substrate 10. The emitter electrode 52 is electrically connected to the emitter terminal 53.

The collector electrode 24 is formed in a back surface of the semiconductor substrate 10. The collector electrode 24 is electrically connected to a collector terminal. The emitter electrode 52 and the collector electrode 24 are formed of conductive materials such as metals. Also, in the present specification, a surface of each component, such as a substrate, a layer, and a region, on the emitter electrode 52 side is referred to as a front surface, and a surface on the collector electrode 24 side is referred to as a back surface or a bottom portion. Also, a direction connecting the emitter electrode 52 and the collector electrode 24 is referred to as a depth direction.

The semiconductor substrate 10 may be a silicon substrate, or may also be a silicon carbide substrate, a nitride semiconductor substrate and the like. A P− type base region 14 is formed on the front surface side of the semiconductor substrate 10. Also, the N+ type emitter region 12 is optionally formed in a part of the region on the front surface side of the base region 14.

Also, the semiconductor substrate 10 further has an N+ type accumulation region 16, an N− type drift region 18, an N− type buffer region 20, a P+ type collector region 22, and an N+ type cathode region 82. The accumulation region 16 is formed on the back surface side of the base region 14. The impurity concentration of the accumulation region 16 may be higher than the impurity concentration of the drift region 18.

The accumulation region 16 is formed between the adjacent trenches. For example, in the transistor section 70, the accumulation region 16 is formed between the dummy trench section 30 and the gate trench section 40. The accumulation region 16 may be provided to cover the whole region between the dummy trench section 30 and the gate trench section 40. By providing the accumulation region 16, the IE effect can be increased and the ON voltage can be decreased.

The drift region 18 is formed on the back surface side of the accumulation region 16. The buffer region 20 is formed on the back surface side of the drift region 18. The impurity concentration of the buffer region 20 is higher than the impurity concentration of the drift region 18. The buffer region 20 may function as a field stop layer to prevent a depletion layer spreading from the back surface side of the base region 14 from reaching the collector region 22 and the cathode region 82.

The collector region 22 is formed on the back surface side of the buffer region 20 in the region of the transistor section 70. The cathode region 82 is formed on the back surface side of the buffer region 20 in the region of the diode section 80. Also, the collector electrode 24 is provided in the back surface of the collector region 22 and the back surface of the cathode region 82.

On the front surface side of the semiconductor substrate 10, one or more gate trench sections 40, one or more dummy trench sections 30, and one or more emitter trench sections 60 are formed. Each trench section penetrates the base region 14 from the front surface of the semiconductor substrate 10 and reaches the drift region 18. In the present example, the gate trench section 40 and the dummy trench section 30 penetrate the emitter region 12, the base region 14, and the accumulation region 16 from the front surface of the semiconductor substrate 10, and reach the drift region 18. Also, the emitter trench section 60 penetrates the base region 14 and the accumulation region 16 from the front surface of the semiconductor substrate 10 and reaches the drift region 18.

The gate trench section 40 has a gate trench formed on the front surface side of the semiconductor substrate 10, an insulation film 42, a gate conductive section 44, and the gate insulation section 37. The insulation film 42 is formed covering an inner wall of the gate trench. The insulation film 42 may be formed oxidizing or nitriding the semiconductor on the inner wall of the gate trench. The gate conductive section 44 is formed, inside the gate trench, on the inner side than the insulation film 42. That is, the insulation film 42 insulates the gate conductive section 44 and the semiconductor substrate 10 from each other. The gate conductive section 44 is formed of conductive materials such as polysilicon.

The gate insulation section 37 is formed above the gate conductive section 44 to insulate the gate conductive section 44 and the emitter electrode 52 from each other. The gate insulation section 37 of the present example is formed covering the insulation film 42 and the gate conductive section 44 in the front surface of the semiconductor substrate 10. A width of the gate insulation section 37 is larger than a width of the trench of the gate trench section 40.

The gate conductive section 44 at least includes a region opposed to the adjacent base region 14. Each gate conductive section 44 is electrically connected to the gate terminal 51. In the present example, the gate conductive section 44 is electrically connected to the gate electrode 50 in the protruding section 43 as shown in FIG. 1. Also, the gate electrode 50 is electrically connected to the gate terminal 51. As a predetermined voltage is applied to the gate conductive section 44 via the gate terminal 51, a channel is formed on an outer layer of an interface of the base region 14 which contacts with the gate trench.

The dummy trench section 30 has a dummy trench, an insulation film 32, a protection section 38, and a dummy conductive section 34 which are formed on the front surface side of the semiconductor substrate 10. The insulation film 32 is formed covering the inner wall of the dummy trench.

The dummy conductive section 34 is formed, inside the dummy trench, on the inner side than the insulation film 32. The insulation film 32 insulates the dummy conductive section 34 and the semiconductor substrate 10 from each other. The dummy conductive section 34 may be formed of the same material as the gate conductive section 44. For example, the dummy conductive section 34 is formed of the conductive material such as polysilicon. The dummy conductive section 34 may have the same length as that of the gate conductive section 44 in the depth direction.

The protection section 38 has an opening (in the present example, the contact hole 54 formed along the center of the dummy trench section 30 shown in FIG. 1) to expose at least a part of the dummy conductive section 34, and covers the insulation film 32 in the front surface of the semiconductor substrate 10. The protection section 38 is formed so as to cover the entire exposed insulation film 32 in the front surface of the semiconductor substrate 10. The protection section 38 covers a region wider than the exposed region of the insulation film 32 in the front surface of the semiconductor substrate 10. The contact hole 54 exposes a part of the front surface of the dummy conductive section 34 and does not expose the insulation film 32. The emitter electrode 52 has a portion formed within the contact hole 54 provided in the protection section 38. The emitter electrode 52 contacts with the dummy conductive section 34 via the portion.

Also, the contact holes 54 (in the present example, the contact holes formed on both sides of the dummy trench section 30 shown in FIG. 1) are also formed between the gate insulation section 37 and the protection section 38. The contact holes 54 expose the front surfaces of the emitter regions 12 between the respective trenches. Note that as shown in FIG. 1, the contact holes 54 also expose the front surface of the contact region 15 between trenches respectively.

The emitter electrode 52 has a portion formed within the contact hole 54. The emitter electrode 52 contacts with the emitter region 12 and the contact region 15 via the portion.

According to the semiconductor apparatus 100 of the present example, by providing the dummy trench section 30, the carrier injection enhanced effect (IE effect) to the drift region can be increased and the ON voltage can be decreased. Then, the protection section 38 protecting the insulation film 32 in the dummy trench section 30 is included. For this reason, the reliability of the insulation film 32 in the vicinity of the trench opening of the dummy trench section 30 can be improved.

For example, even if a stress is generated in the insulation film 32 in the vicinity of the trench opening in a case where wire bonding is performed on the semiconductor apparatus 100, the insulation of the insulation film 32 can be maintained. Also, although it becomes easy to generate a defect of the insulation film 32 in the vicinity of the trench opening while miniaturizing the semiconductor apparatus 100, the defect can be made up by providing the protection section 38 and the insulation can be maintained.

The gate trench section 40 and the dummy trench section 30 in the present example are alternately arranged in a predetermined array direction as shown in FIG. 2. Also, each trench section may be arranged at a constant interval. However, the arrangement of each trench is not limited to the above-described example. A plurality of gate trench sections 40 may be arranged between two dummy trench sections 30. Also, the number of the gate trench sections 40 provided between the respective dummy trench sections 30 may not be constant. Lengths in the depth direction of the dummy trench section 30 and the gate trench section 40 may be the same.

The diode section 80 is provided in the region adjacent to the transistor section 70. The diode section 80 has the base region 14, the accumulation region 16, the drift region 18, and the buffer region 20 in the same layer as the layer in which the transistor section 70 is. A cathode region 82 is provided on the back surface side of the buffer region 20 of the diode section 80. Also, the diode section 80 has one or more emitter trench sections 60. Also, the emitter region 12 is not formed in the diode section 80.

The emitter trench section 60 is formed from the front surface side of the base region 14, penetrating the base region 14 and the accumulation region 16 and reaching the drift region 18. Each emitter trench section 60 has an insulation film 62, the protection section 38, and an emitter conductive section 64, similar to the dummy trench section 30. The emitter trench section 60 may have the same structure as that of the dummy trench section 30.

The insulation film 62 is formed covering the inner wall of the emitter trench. The emitter conductive section 64 is formed, inside the emitter trench, on the inner side than the insulation film 62. The insulation film 62 insulates the emitter conductive section 64 and the semiconductor substrate 10 from each other. The emitter conductive section 64 may be formed of the same material as the dummy conductive section 34. For example, the emitter conductive section 64 is formed of the conductive material such as polysilicon. The emitter conductive section 64 may have the same length as that of the dummy conductive section 34 in the depth direction.

The protection section 38 has an opening (in the present example, the contact hole 54) to expose at least a part of the emitter conductive section 64, and covers the insulation film 62 on the front surface of the semiconductor substrate 10. The protection section 38 is formed so as to cover the entire insulation film 62 which is exposed on the front surface of the semiconductor substrate 10. The protection section 38 covers a region wider than the exposed region of the insulation film 62 in the front surface of the semiconductor substrate 10. The contact hole 54 exposes a part of the front surface of the emitter conductive section 64 and does not expose the insulation film 62. The emitter electrode 52 has a portion formed within the contact hole 54 provided in the protection section 38. The emitter electrode 52 contacts with the emitter conductive section 64 via the portion. According to the semiconductor apparatus 100 of the present example, the reliability of the insulation film 62 in the vicinity of the trench opening of the emitter trench section 60 can be improved.

Also, the interval between the trench sections in the transistor section 70 in the present example is the same as the interval between the emitter trench sections 60 in the diode section 80. As shown in FIG. 2, in a case where the gate trench section 40 and the dummy trench section 30 are alternately arranged in the transistor section 70, the interval between the gate trench section 40 and the dummy trench section 30 may be the same as the interval between the emitter trench sections 60.

Figure 3:
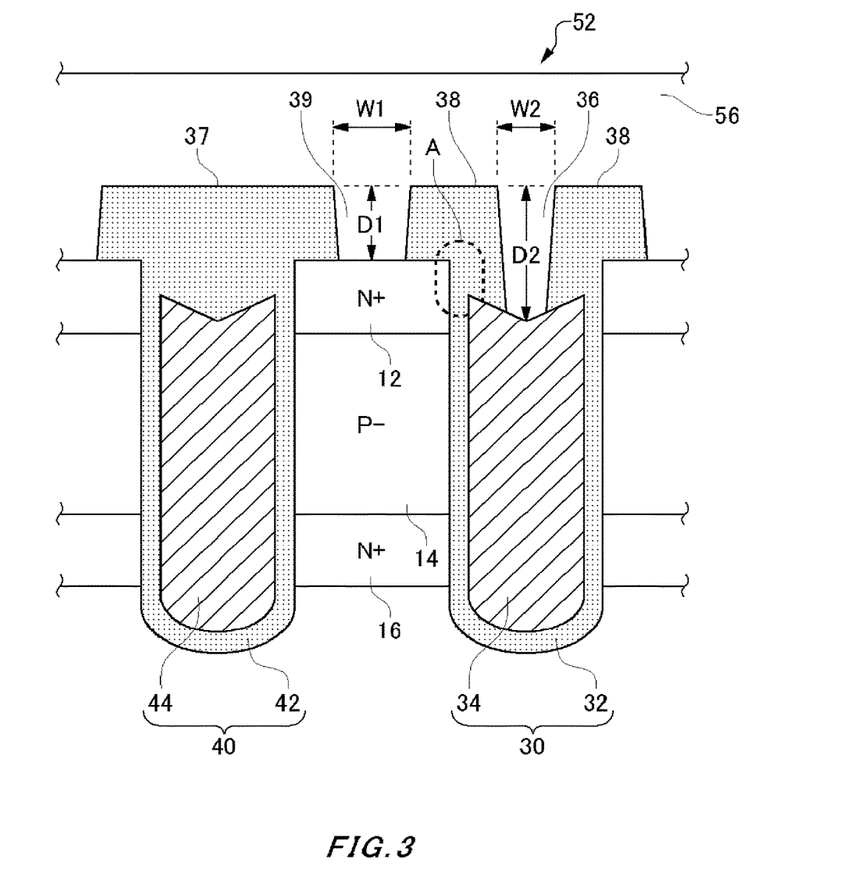
FIG. 3 is an enlarged cross sectional view enlarging structures of peripheries of a dummy trench section 30 and a gate trench section 40.

FIG. 3 is an enlarged cross sectional view enlarging structures of peripheries of the dummy trench section 30 and the gate trench section 40. As described above, the gate trench section 40 and the dummy trench section 30 are formed penetrating the emitter region 12, the base region 14, and the accumulation region 16, from the front surface of the semiconductor substrate 10.

The insulation films (32, 42) and the conductive sections (34, 44) are formed within each trench of the dummy trench section 30 and the gate trench section 40. In the present example, the shapes and the sizes of the insulation films (32, 42) and the conductive sections (34, 44) in the dummy trench section 30 and the gate trench section 40 are the same.

The gate insulation section 37 covers the entire gate trench in the front surface of the semiconductor substrate 10. On the other hand, the protection section 38 covers the entire exposed insulation film 32 and a part of the exposed dummy conductive section 34 on the front surface of the semiconductor substrate 10. In the protection section 38, an opening is formed to expose the front surface of the dummy conductive section 34.

The gate insulation section 37 and the protection section 38 are formed apart from each other. In the present example, an opening with a predetermined width W1 and a predetermined depth D1 is formed between the gate insulation section 37 and the protection section 38 adjacent to each other. The protection section 38 adjacent to the gate insulation section 37 refers to the protection section 38 which is in the distance closest to the gate insulation section 37 among the one or more protection sections 38.

According to the opening, the emitter region 12 in the mesa section is exposed. The width of the opening refers to the width in a linear direction connecting the gate trench section 40 and the dummy trench section 30 by the shortest distance. Also, the width of the opening refers to the width on the outermost front surface side of the semiconductor apparatus 100. That is, in case where the opening is provided from the emitter electrode 52 side to the semiconductor substrate 10 side, the width of the opening refers to the width of the opening on the emitter electrode 52 side.

The opening, which is formed in the protection section 38 and exposes the front surface of the dummy conductive section 34, has a predetermined width W2 and a predetermined depth D2. The width W2 of the opening formed in the protection section 38 may be smaller than the width W1 of the opening formed between the gate insulation section 37 and the protection section 38. By enlarging the width W1, the contact area between the emitter region 12 and the emitter electrode 52 can be secured. Also, by setting the width W2 small, the size of the semiconductor apparatus 100 can be set small. Since no currents flow between the dummy conductive section 34 and the emitter electrode 52, even if the resistance rises by setting the width W2 of the opening small, the loss does not increase.

The emitter electrode 52 has a dummy plug section 36 provided corresponding to each dummy trench section 30, a mesa plug section 39 provided corresponding to each mesa section, and an electrode section 56.

The dummy plug section 36 is formed within the opening of the protection section 38 and contacts with the front surface of the dummy conductive section 34. The front surface of the dummy conductive section 34 may have a shape in which the center is more recessed than other portions. The opening of the protection section 38 exposes the center of the dummy conductive section 34, and the dummy plug section 36 contacts with the region including the center of the dummy conductive section 34. The dummy plug section 36 is formed of materials containing tungsten. Accordingly, the dummy plug section 36 can be also easily formed in the opening having the small width W2.

The front surface of the dummy conductive section 34 may be arranged on the back surface side of the semiconductor substrate 10 than the front surface of the emitter region 12. That is, the front surface of the dummy conductive section 34 may be arranged in a position deeper than the front surface of the emitter region 12, viewed from the front surface of the semiconductor substrate 10. The dummy conductive section 34 of the present example is arranged in the position where its edge portion is deeper than the front surface of the emitter region 12. In this case, the length D2 in the depth direction of the dummy plug section 36 is longer than the length D1 of the mesa plug section 39.

The protection section 38 covers the edge portion of the front surface of the dummy conductive section 34. According to such a configuration, a defect of the insulation material in the vicinity of the edge portion of the dummy conductive section 34, like the region A shown in FIG. 3, can be prevented.

In the region A, the more the semiconductor apparatus 100 is miniaturized, the more easily the defect of the insulation material (for example, a generation of bird's beak) is generated. On the other hand, according to the semiconductor apparatus 100, by providing the protection section 38, the reliability of the insulation of the dummy conductive section 34 from other regions can be maintained.

The mesa plug section 39 is formed within the opening between the protection section 38 and the gate insulation section 37 and contacts with the emitter region 12 in the front surface of the semiconductor substrate 10. The front surface of the emitter region 12 may be flatter than the front surface of the dummy conductive section 34. That the front surface is flatter refers to that the maximum difference in height in the front surface is smaller. The mesa plug section 39 may be formed of the same material as the dummy plug section 36. For example, the mesa plug section 39 is formed of the material including tungsten.

The electrode section 56 is formed above the mesa plug section 39 and the dummy plug section 36, and connects the dummy plug section 36 and the mesa plug section 39. The electrode section 56 may be formed in the entire region where the emitter electrode 52 shown in FIG. 1 is provided. The electrode section 56 may be formed of a metal material different from that of the dummy plug section 36. For example, the electrode section 56 is formed of the metal material which does not include tungsten. As one example, the electrode section 56 is an aluminum electrode. Note that the protection section 38 and the dummy plug section 36 in the dummy trench section 30 are shown in FIG. 3, the protection section 38 and the emitter plug section in the emitter trench section 60 may have the same structures.

Figure 4:
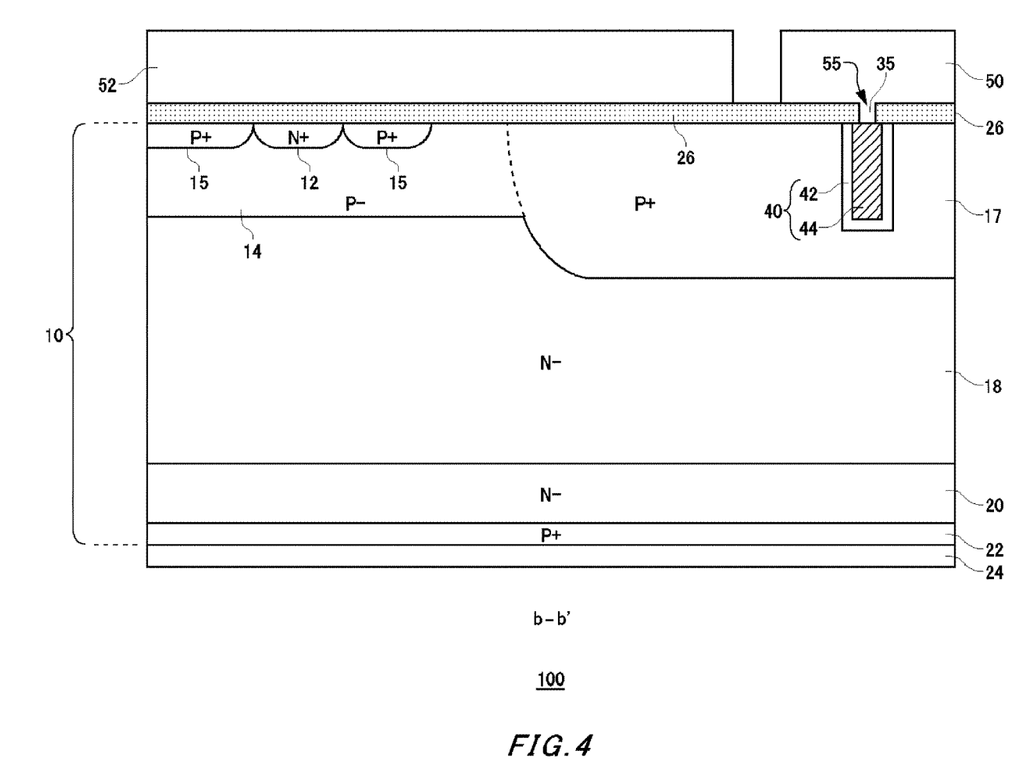
FIG. 4 is a drawing showing one example of a cross section b-b' in FIG. 1.

FIG. 4 is a drawing showing one example of a cross section b-b' in FIG. 1. The semiconductor apparatus 100 of the present example has the semiconductor substrate 10, the interlayer insulation film 26, the gate electrode 50, the emitter electrode 52, and the collector electrode 24 in the cross section. The interlayer insulation film 26 is formed between the semiconductor substrate 10 and both the gate electrode 50 and the emitter electrode 52. An opening (in the present example, a contact hole 55) is formed in the interlayer insulation film 26.

The contact hole 55 exposes at least a part of the gate conductive section 44 in the protruding section 43 of the gate trench section 40 in the front surface of the semiconductor substrate 10. The gate electrode 50 contacts with the gate conductive section 44 in the protruding section 43 through the contact hole 55. The gate electrode 50 may have a metal gate plug section 35 formed within the contact hole 55.

The gate plug section 35 contacts with the front surface of the gate conductive section 44. The gate plug section 35 may be formed of the same material as the dummy plug section 36. For example, the gate plug section 35 is formed of the metal material containing tungsten.

The gate conductive section 44 may have the same shape as that of the dummy conductive section 34 shown in FIG. 3. In this case, the gate plug section 35 may also have the same length as that of the dummy plug section 36 shown in FIG. 3. The gate plug section 35 may have the same width as that of the dummy plug section 36. The width of the gate plug section 35 refers to the width in the b-b' direction in FIG. 1. The width of the gate plug section 35 in the present example refers to the width of the gate plug section 35 in the extending direction in which the dummy trench section 30 extends.

Next, one example of a manufacturing method of the semiconductor apparatus 100 shown from FIG. 1 to FIG. 4 is described. However, the manufacturing method of the semiconductor apparatus 100 is not limited to the present example. First, the semiconductor substrate 10 of the same conductivity type as that of the drift region 18 (in the present example, N− type is described) is prepared.

Next, an etching mask in a predetermined pattern is provided in the front surface of the semiconductor substrate 10 to form a plurality of trenches used for the gate trench section 40, the dummy trench section 30, and the emitter trench section 60. After the trenches are formed, insulation films are formed on inner walls of the trenches respectively. Then, a conductive material is filled within the trench.

Next, P type impurities are injected from the front surface side of the semiconductor substrate and a heat treatment is performed at a temperature of about 1100° C. for about 2 hours to form, in the entire front surface of the semiconductor substrate 10, a P− type base region 14 which is shallower than the trench. Next, N type impurities are injected from the front surface side of the semiconductor substrate 10 to form a N+ type accumulation region 16 which is deeper than the base region 14 and shallower than the trench. For example, by performing ion implantation of phosphorous of about $5.0 \times 10^{12}/cm^2$ at an acceleration voltage of 2.8 MeV, the N+ type accumulation region 16 is formed.

Next, the N type impurities are optionally injected from the front surface side of the semiconductor substrate 10 by using a mask where a portion corresponding to the emitter region 12 is opened. Accordingly, the N+ type emitter region 12 is optionally formed inside the P− type base region 14.

After that, the interlayer insulation film 26 in a predetermined pattern is formed on the front surface side of the semiconductor substrate 10. A part of the interlayer insulation film 26 functions as the gate insulation section 37 and the protection section 38. The interlayer insulation film 26 can be formed by etching in a predetermined mask pattern after forming the insulation film in the entire front surface of the semiconductor substrate 10. In the interlayer insulation film 26, the contact hole 54 and the contact hole 55 are formed. Then, the emitter electrode 52 and the gate electrode 50 are formed. After forming the gate plug section 35, the dummy plug section 36, and the mesa plug section 39, each electrode may be formed in the front surface of the semiconductor substrate 10.

Next, ion implantation of selenium of about $1.0 \times 10^{14}/cm^2$, for example, is performed from the back surface side of the semiconductor substrate 10, and after that, the heat treatment is performed at a temperature of about 900° C. for about 2 hours. Accordingly, the N− type buffer region 20 is formed on the back surface side of the semiconductor substrate 10. The remained N− type region of the semiconductor substrate 10 becomes the drift region 18. The buffer region 20 can be formed in a deep position by using selenium having a large diffusion coefficient. Also, before forming the buffer region 20, the semiconductor substrate 10 may be polished to adjust its thickness.

Instead of the ion implantation of selenium, the N− type buffer region 20 may be formed by performing ion implantation of proton by different dose amounts for a plurality of times. Accordingly, the buffer region 20 in which the impurity concentration increases from the substrate front surface side to the substrate back surface side can be formed.

Next, ion implantation of the P type impurities is performed from the back surface side to the semiconductor substrate 10 by a dose amount which is equal to or greater than $1.0 \times 10^{13}/cm^2$ and equal to or less than $4.0 \times 10^{13}/cm^2$, for example. Accordingly, the P+ type collector region 22 is formed on the back surface side of the semiconductor substrate 10, which is thinner than the buffer region 20. It is not preferable if the dose amount of the P type impurities is less than $1.0 \times 10^{13}/cm^2$ since ohmic junction cannot be formed between the collector region and the collector electrode. Also, the cathode region 82 is formed in the diode section 80. Then, the collector electrode 24 and the like are appropriately formed on the back surface side of the semiconductor substrate 10.

Figure 5:
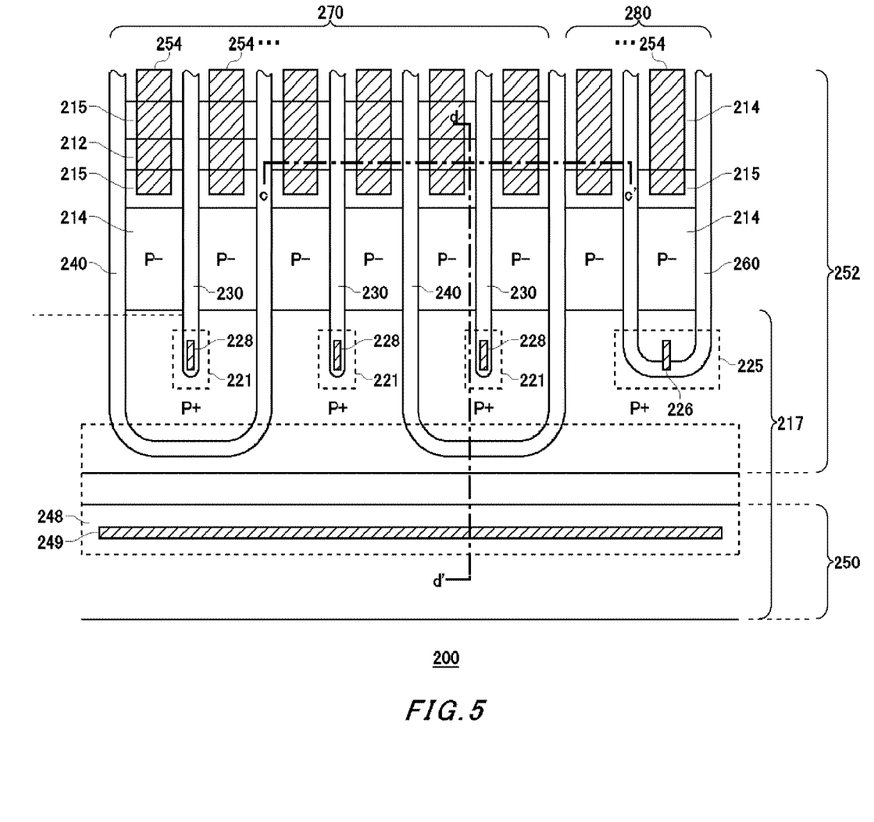
FIG. 5 is a drawing showing a configuration of a semiconductor apparatus 200 according to a comparative example.

FIG. 5 is a drawing showing a configuration of the semiconductor apparatus 200 according to a comparative example. The semiconductor apparatus 200 has a transistor section 270 and a diode section 280. Also, the semiconductor apparatus 200 has, on the front surface side, a gate electrode 250, an emitter electrode 252, a gate trench section 240, a dummy trench section 230, an emitter trench section 260, a well region 217, an emitter region 212, a base region 214, a contact region 215, contact holes 226, 228, 249, and 254, and polysilicon layers 221, 225, and 248.

Figure 6:
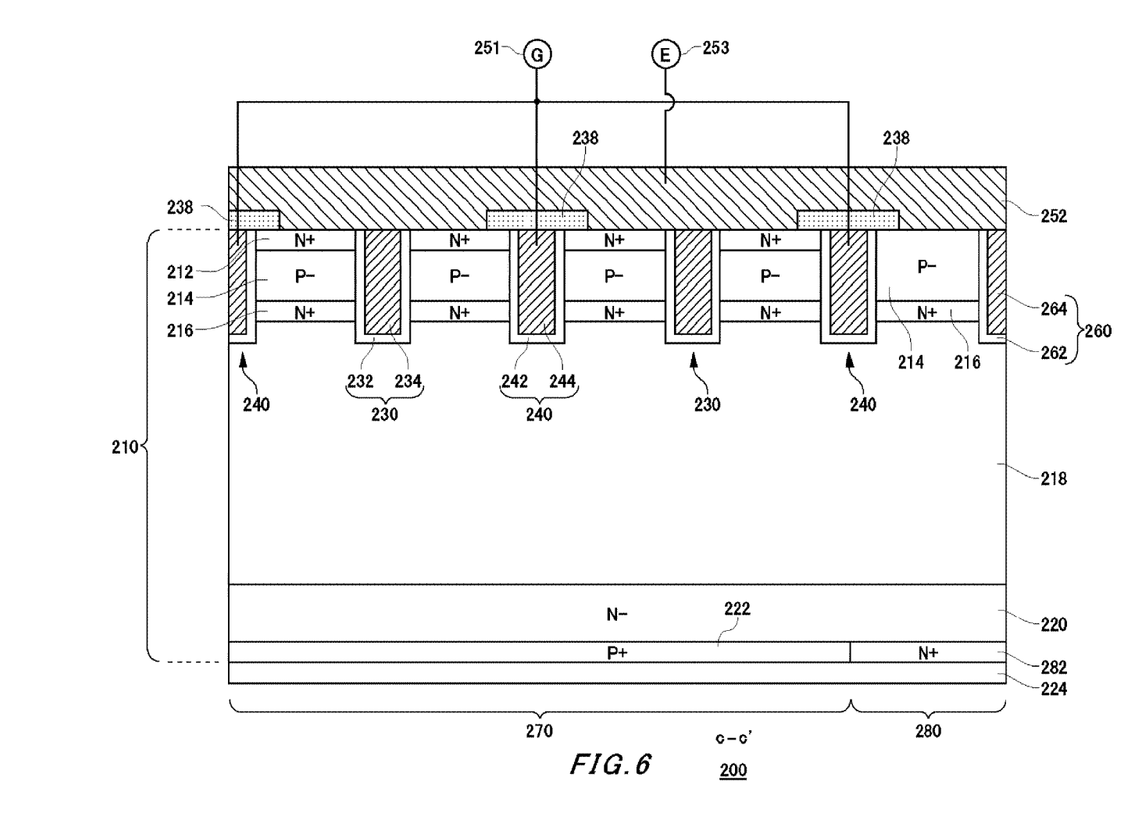
FIG. 6 is a drawing showing a cross section c-c' in FIG. 5.

FIG. 6 is a drawing showing a cross section c-c' in FIG. 5. The semiconductor apparatus 200 has the semiconductor substrate 210, the emitter electrode 252, the insulation section 238, and the collector electrode 224 in the cross section. Also, the gate terminal 251 is electrically connected to the gate conductive section 244, and the emitter terminal 253 is electrically connected to the emitter electrode 252.

In the semiconductor substrate 210, the gate trench section 240, the dummy trench section 230, the emitter trench section 260, the emitter region 212, the base region 214, the accumulation region 216, the drift region 218, the buffer region 220, the collector region 222, and the cathode region 282 are formed. The gate trench section 240 has an insulation film 242 and a gate conductive section 244. The dummy trench section 230 has an insulation film 232 and a dummy conductive section 234. The emitter trench section 260 has an insulation film 262 and an emitter conductive section 264.

The insulation section 238 covers each gate trench section 240. However, the insulation section 238 does not cover the dummy trench section 230 and the emitter trench section 260. After forming the insulation layer on the front surface of the semiconductor substrate 210, the insulation section 238 covering the gate trench section 240 is formed by etching the insulation layer which is covering the dummy trench section 230 and the emitter trench section 260. For this reason, since the insulation films 232, 262 in the vicinity of each trench opening of the dummy trench section 230 and the emitter trench section 260 may be etched in some cases, the reliability of the insulation film is lowered. The more the semiconductor apparatus 200 is miniaturized, the more significant this problem becomes. On the other hand, according to the semiconductor apparatus 100, since the protection section 38 is provided, the reliability of the insulation film in the vicinity of each trench opening can be maintained.

Figure 7:
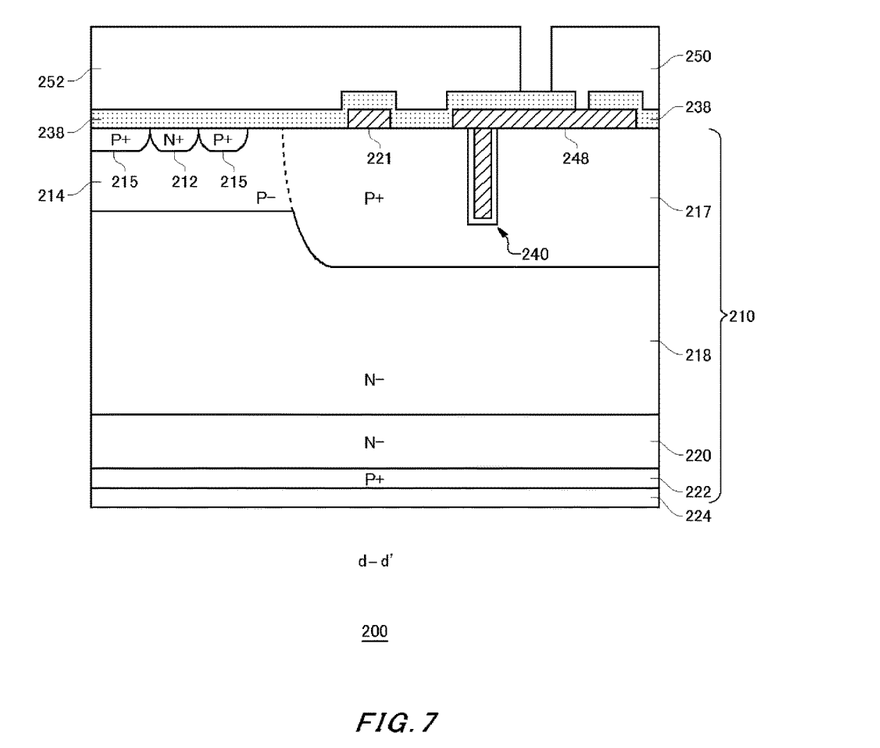
FIG. 7 is a drawing showing a cross section d-d' in FIG. 5.

FIG. 7 is a drawing showing a cross section d-d' in FIG. 5. The semiconductor apparatus 200 comprises a semiconductor substrate 210, an emitter electrode 252, a gate electrode 250, a collector electrode 224, a polysilicon layer 221, a polysilicon layer 248, and an insulation section 238 in the cross section.

The polysilicon layer 221 and the polysilicon layer 248 are formed on the front surface of the semiconductor substrate 210 and connect the conductive section, which is in each trench, and the emitter electrode 252 or the gate electrode 250. The semiconductor apparatus 200 optionally has the polysilicon layer 221 and the polysilicon layer 248 on the front surface of the semiconductor substrate 210. For this reason, unevenness is generated on the front surface of the semiconductor substrate 210 and the formations of layers, such as the insulation section 238, formed above the front surface of the semiconductor substrate 210 becomes not easy.

On the other hand, according to the semiconductor apparatus 100, since the emitter electrode 252 and the gate electrode 250 directly contact the conductive section which is in each trench, a polysilicon layer may not be provided on the front surface of the semiconductor substrate 10. For this reason, the unevenness on the front surface of the semiconductor substrate 10 can be decreased.

While the embodiments of the present invention have been described, the technical scope of the invention is not limited to the above-described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10 . . . semiconductor substrate, 12 . . . emitter region, 14 . . . base region, 15 . . . contact region, 16 . . . accumulation region, 17 . . . well region, 18 . . . drift region, 20 . . . buffer region, 22 . . . collector region, 24 . . . collector electrode, 26 . . . interlayer insulation film, 30 . . . dummy trench section, 32 . . . insulation film, 34 . . . dummy conductive section, 35 . . . gate plug section, 36 . . . dummy plug section, 37 . . . gate insulation section, 38 . . . protection section, 39 . . . mesa plug section, 40 . . . gate trench section, 41 . . . opposing section, 42 . . . insulation film, 44 . . . gate conductive section, 43 . . . protruding section, 50 . . . gate electrode, 51 . . . gate terminal, 52 . . . emitter electrode, 53 . . . emitter terminal, 54 . . . contact hole, 55 . . . contact hole, 56 . . . electrode section, 60 . . . emitter trench section, 62 . . . insulation film, 64 . . . emitter conductive section, 70 . . . transistor section, 80 . . . diode section, 82 . . . cathode region, 100 . . . semiconductor apparatus, 200 . . . semiconductor apparatus, 210 . . . semiconductor substrate, 212 . . . emitter region, 214 . . . base region, 215 . . . contact region, 216 . . . accumulation region, 217 . . . well region, 218 . . . drift region, 220 . . . buffer region, 221 . . . polysilicon layer, 222 . . . collector region, 224 . . . collector electrode, 225 . . . polysilicon layer, 226 . . . contact hole, 228 . . . contact hole, 230 . . . dummy trench section, 232 . . . insulation film, 234 . . . dummy conductive section, 238 . . . insulation section, 240 . . . gate trench section, 242 . . . insulation film, 244 . . . gate conductive section, 248 . . . polysilicon layer, 249 . . . contact hole, 250 . . . gate electrode, 251 . . . gate terminal, 252 . . . emitter electrode, 253 . . . emitter terminal, 254 . . . contact hole, 260 . . . emitter trench section, 262 . . . insulation film, 264 . . . emitter conductive section, 270 . . . transistor section, 280 . . . diode section, 282 . . . cathode region

What is claimed is:

1. A semiconductor apparatus, comprising:
a semiconductor substrate;
a dummy trench section which is formed in a front surface of the semiconductor substrate; and
a first front-surface-side electrode containing metals, which is formed above the front surface of the semiconductor substrate, wherein
the dummy trench section has:
a dummy trench which is formed in the front surface of the semiconductor substrate;
an insulation film which is formed on an inner wall of the dummy trench;
a dummy conductive section which is formed, inside the dummy trench, on an inner side of the insulation film; and
a protection section which has an opening to expose a part of an upper surface of the dummy conductive section and covers the insulation film in the front surface of the semiconductor substrate, a width of the opening of the protection section being smaller than a width of the dummy conductive section of the dummy trench,
the first front-surface-side electrode has a portion formed within the opening of the protection section and contacts with the dummy conductive section,
an edge portion of a front surface of the dummy conductive section is arranged in a deeper position than a front surface of an emitter region of the semiconductor substrate, and
the protection section directly covers the edge portion of the front surface of the dummy conductive section.

2. The semiconductor apparatus according to claim 1, further comprising:
a gate trench section which is formed in the front surface of the semiconductor substrate, wherein
the gate trench section has:
a gate trench which is formed in the front surface of the semiconductor substrate;
an insulation film which is formed on an inner wall of the gate trench;
a gate conductive section which is formed, inside the gate trench, on an inner side than the insulation film; and
a gate insulation section which is provided above the gate conductive section and insulates the gate conductive section and the first front-surface-side electrode from each other.

3. The semiconductor apparatus according to claim 2, wherein
the gate insulation section is provided covering the gate trench in the front surface of the semiconductor substrate, and
the width of the opening formed in the protection section is smaller than a distance between the protection section and the gate insulation section which are provided adjacent to each other.

4. The semiconductor apparatus according to claim 2, wherein
the first front-surface-side electrode has:
a dummy plug section which is formed of metal and which is formed in the opening of the protection section and contacts with the dummy conductive section; and
an electrode section which is formed above the dummy plug section and which is formed of a metal material different from the dummy plug section.

5. The semiconductor apparatus according to claim 4, wherein the dummy plug section contains tungsten.

6. The semiconductor apparatus according to claim 4, wherein
the first front-surface-side electrode further comprises a mesa plug section which is formed of the same material as the dummy plug section, is formed between the protection section and the gate insulation section, and contacts with the front surface of the semiconductor substrate.

7. The semiconductor apparatus according to claim 6, wherein
the dummy plug section is longer than the mesa plug section in a depth direction.

8. The semiconductor apparatus according to claim 4, wherein
the dummy trench section is formed extending in a predetermined extending direction in the front surface of the semiconductor substrate, wherein
the gate trench section has:
an opposing section which is formed extending in the extending direction in an area opposed to the dummy trench section; and
a protruding section which is formed further extending from the opposing section in an area not opposed to the dummy trench section,
the semiconductor apparatus further comprises a second front-surface-side electrode which is formed above the protruding section, and
the gate conductive section in the protruding section is electrically connected to the second front-surface-side electrode.

9. The semiconductor apparatus according to claim 8, wherein
the gate insulation section of the protruding section has an opening to expose the gate conductive section, and
the second front-surface-side electrode has a gate plug section which is formed of metal and which is formed within the opening of the gate insulation section and contacts with the gate conductive section.

10. The semiconductor apparatus according to claim 9, wherein the gate plug section is formed of the same material as the dummy plug section.

11. The semiconductor apparatus according to claim 9, wherein
the gate plug section has the same length as the dummy plug section in a depth direction.

12. The semiconductor apparatus according to claim 2, wherein
the gate insulation section and the protection section are parts of an interlayer insulation film of a single layer formed in a predetermined pattern on the front surface of the semiconductor substrate.

13. The semiconductor apparatus according to claim 2, wherein
each of the gate insulation section and the protection section is an interlayer insulation film formed in a predetermined pattern on the front surface of the semiconductor substrate, and
the interlayer insulation film is a PSG film or a BPSG film.

14. The semiconductor apparatus according to claim 1, wherein
a central section of the dummy conductive section has a recessed shape.

15. The semiconductor apparatus according to claim 1, wherein a contact hole of the dummy trench section is provided between contact holes of adjacent mesa portions.

16. A semiconductor apparatus, comprising:
a semiconductor substrate;
a dummy trench section which is formed in a front surface of the semiconductor substrate;
a first front-surface-side electrode containing metals, which is formed above the front surface of the semiconductor substrate; and
a gate trench section which is formed in the front surface of the semiconductor substrate;
wherein
the dummy trench section has:
a dummy trench which is formed in the front surface of the semiconductor substrate;
an insulation film which is formed on an inner wall of the dummy trench;
a dummy conductive section which is formed, inside the dummy trench, on an inner side of the insulation film; and
a protection section which has an opening to expose at least a part of the dummy conductive section and covers the insulation film in the front surface of the semiconductor substrate,
the first front-surface-side electrode has a portion formed within the opening of the protection section and contacts with the dummy conductive section,
an edge portion of a front surface of the dummy conductive section is arranged in a deeper position than a front surface of an emitter region of the semiconductor substrate,
the protection section directly covers the edge portion of the front surface of the dummy conductive section,
the gate trench section has:
a gate trench which is formed in the front surface of the semiconductor substrate;
an insulation film which is formed on an inner wall of the gate trench;
a gate conductive section which is formed, inside the gate trench, on an inner side than the insulation film; and
a gate insulation section which is provided above the gate conductive section and insulates the gate conductive section and the first front-surface-side electrode from each other,
the first front-surface-side electrode has:
a dummy plug section which is formed of metal and which is formed in the opening of the protection section and contacts with the dummy conductive section; and
an electrode section which is formed above the dummy plug section and which is formed of a metal material different from the dummy plug section, and
the first front-surface-side electrode further comprises a mesa plug section which is formed of the same material as the dummy plug section, is formed between the protection section and the gate insulation section, and contacts with the front surface of the semiconductor substrate.

17. A semiconductor apparatus, comprising:
a semiconductor substrate;
a dummy trench section which is formed in a front surface of the semiconductor substrate;
a first front-surface-side electrode containing metals, which is formed above the front surface of the semiconductor substrate; and
a gate trench section which is formed in the front surface of the semiconductor substrate;
wherein
the dummy trench section has:
a dummy trench which is formed in the front surface of the semiconductor substrate;
an insulation film which is formed on an inner wall of the dummy trench;
a dummy conductive section which is formed, inside the dummy trench, on an inner side of the insulation film; and
a protection section which has an opening to expose at least a part of the dummy conductive section and covers the insulation film in the front surface of the semiconductor substrate,
the first front-surface-side electrode has a portion formed within the opening of the protection section and contacts with the dummy conductive section,
an edge portion of a front surface of the dummy conductive section is arranged in a deeper position than a front surface of an emitter region of the semiconductor substrate,
the protection section directly covers the edge portion of the front surface of the dummy conductive section,
the gate trench section has:
a gate trench which is formed in the front surface of the semiconductor substrate;
an insulation film which is formed on an inner wall of the gate trench;
a gate conductive section which is formed, inside the gate trench, on an inner side than the insulation film; and
a gate insulation section which is provided above the gate conductive section and insulates the gate conductive section and the first front-surface-side electrode from each other,
the first front-surface-side electrode has:
a dummy plug section which is formed of metal and which is formed in the opening of the protection section and contacts with the dummy conductive section; and
an electrode section which is formed above the dummy plug section and which is formed of a metal material different from the dummy plug section,
the dummy trench section is formed extending in a predetermined extending direction in the front surface of the semiconductor substrate, the gate trench section has:
- an opposing section which is formed extending in the extending direction in an area opposed to the dummy trench section; and
- a protruding section which is formed further extending from the opposing section in an area not opposed to the dummy trench section,
- the semiconductor apparatus further comprises a second front-surface-side electrode which is formed above the protruding section, and
- the gate conductive section in the protruding section is electrically connected to the second front-surface-side electrode.

* * * * *